United States Patent
Korman

(10) Patent No.: US 9,006,940 B2
(45) Date of Patent: Apr. 14, 2015

(54) MODULAR PORTABLE ENERGY SYSTEM

(76) Inventor: Bette Korman, New York, NY (US)

( * ) Notice: Subject to any disclaimer, the term of this patent is extended or adjusted under 35 U.S.C. 154(b) by 315 days.

(21) Appl. No.: 13/360,162

(22) Filed: Jan. 27, 2012

(65) Prior Publication Data

US 2012/0235477 A1 Sep. 20, 2012

Related U.S. Application Data

(60) Provisional application No. 61/462,074, filed on Jan. 28, 2011.

(51) Int. Cl.

| | |
|---|---|
| *H01L 35/00* | (2006.01) |
| *H01L 31/042* | (2014.01) |
| *F24J 2/52* | (2006.01) |
| *E04H 15/00* | (2006.01) |
| *E04H 15/58* | (2006.01) |
| *E04F 10/00* | (2006.01) |
| *E04F 10/02* | (2006.01) |
| *E04F 10/04* | (2006.01) |
| *E06B 9/24* | (2006.01) |

(52) U.S. Cl.
CPC ............... *H01L 31/042* (2013.01); *F24J 2/523* (2013.01); *E04H 15/008* (2013.01); *E04H 15/58* (2013.01); *Y02E 10/50* (2013.01); *Y02E 10/47* (2013.01); *E04F 10/005* (2013.01); *E06B 2009/2476* (2013.01); *A45B 2200/1027* (2013.01); *E04F 10/02* (2013.01); *E04F 10/04* (2013.01); *H02S 20/00* (2013.01)

(58) Field of Classification Search
USPC ............ 136/245, 251; 320/107, 114; 307/149
See application file for complete search history.

(56) References Cited

U.S. PATENT DOCUMENTS

| | | | |
|---|---|---|---|
| 4,713,492 | A | 12/1987 | Hanak |
| 5,244,508 | A | 9/1993 | Colozza |
| 6,491,051 | B2 | 12/2002 | Pierce et al. |
| 6,675,580 | B2 | 1/2004 | Ansley et al. |
| 7,388,348 | B2 | 6/2008 | Mattichak |
| 7,508,163 | B2 | 3/2009 | Batts-Gowins |
| 7,565,968 | B2 | 7/2009 | Lindley |
| D626,503 | S | 11/2010 | Lui |
| 7,839,019 | B2 | 11/2010 | Chang et al. |

(Continued)

FOREIGN PATENT DOCUMENTS

| | | |
|---|---|---|
| CN | 201204942 | 3/2009 |
| JP | 2005-116722 | 4/2005 |
| WO | WO 2004/077576 | 9/2004 |

OTHER PUBLICATIONS

Boico, F.; Lehman, B.; Shujaee, Khalil, "Solar Battery Chargers for NiMH Batteries," Power Electronics, IEEE Transactions on, vol. 22, No. 5, pp. 1600, 1609, Sep. 2007.*

(Continued)

*Primary Examiner* — Daniel Cavallari
(74) *Attorney, Agent, or Firm* — McCarter & English, LLP

(57) ABSTRACT

The present invention relates to modular portable energy systems, specifically solar energy systems or kits. In a first embodiment, a personal solar kit is provided. A portable shelter system with power generation capabilities is provided in a second embodiment. In a third embodiment, alternative power generation systems are provided. A multi-layered solar power generation device is provided in a fourth embodiment. In a fifth embodiment an energy network system is provided that can be used with any of the previous embodiments of the present invention.

20 Claims, 32 Drawing Sheets

(56) References Cited

U.S. PATENT DOCUMENTS

| | | |
|---|---|---|
| 7,884,502 B2 | 2/2011 | Lyman et al. |
| 2005/0161079 A1* | 7/2005 | Gray .............................. 136/291 |
| 2005/0268962 A1* | 12/2005 | Gaudiana et al. ............. 136/255 |
| 2007/0012349 A1 | 1/2007 | Gaudiana et al. |
| 2007/0017566 A1 | 1/2007 | Gaudiana et al. |
| 2009/0102415 A1* | 4/2009 | Muchow et al. .............. 320/101 |
| 2009/0230783 A1 | 9/2009 | Weed et al. |
| 2010/0122722 A1* | 5/2010 | Halpern ........................ 136/246 |
| 2011/0005560 A1* | 1/2011 | Nair ................................ 135/96 |
| 2011/0012552 A1* | 1/2011 | Margalit ....................... 320/101 |
| 2011/0017262 A1 | 1/2011 | Oppizzi |
| 2011/0204843 A1 | 8/2011 | Foster |
| 2011/0214667 A1* | 9/2011 | Baruh ........................... 126/625 |
| 2013/0240015 A1* | 9/2013 | Chaimovski et al. ......... 136/245 |

OTHER PUBLICATIONS

International Search Report of the International Searching Authority mailed Aug. 17, 2012, issued in connection with International Patent Appln. No. PCT/US12/22922 (3 pages).

Written Opinion of the International Searching Authority mailed Aug. 17, 2012, issued in connection with International Patent Appln. No. PCT/US12/22922 (5 pages).

* cited by examiner

MODULAR PORTABLE ENERGY SYSTEM

RELATED APPLICATIONS

This application claims the benefit of U.S. Provisional Application Ser. No. 61/462,074, filed on Jan. 28, 2011, the entire disclosure of which is expressly incorporated by reference.

BACKGROUND OF THE INVENTION

1. Field of the Invention

The present invention relates generally to the field of energy production and distribution. More specifically, the present invention relates to a modular portable energy system (or kit) that can be easily transported and set up to generate electrical power in a variety of environments.

2. Related Art

Renewable energy is an important and growing field, particularly in connection with solar energy. Various systems have been implemented to harness solar energy, including solar panels installed on roofs and in other locations. However, many current solar panel applications are not easily transportable. Indeed, such systems are often large and cumbersome to set up, and are not user-friendly. Additionally, existing solar energy systems are often not intended for personal use, nor are they easily attachable or removable from permanent and/or temporary structures.

Flexible solar panel technology is known in the art. However, such systems are often deployed as "pass-through" systems, such that energy is not stored locally, i.e., at or near the point of generation. Further, such systems do not include adequate circuitry for balancing accumulated power. Moreover, known flexible solar panel systems are "stand alone" and isolated units without complex distribution systems that can send electrical energy to multiple appliances at once. Further, other flexible panel systems don't offer lightweight, high-wattage energy to power appliances for different environmental needs, i.e., survival, recreational, military, communication, etc.

Moreover, in view of existing technology in this field, what would be desirable is a system, or kit, that generates solar energy, and which is easily collapsible and transportable. Further, what would be desirable is the use of such a system with power generating and harvesting technologies, as well as in connection with other advantageous devices and/or applications, such as in connection with personal power systems, portable shelters, as well as other alternate energy sources. Even further, it would be desirable to create a scalable network of such energy systems capable of communicating with each other, such as by wireless technology, and sharing and allocating power to meet various electrical consumption needs. Accordingly, what would be desirable, but has not yet been provided, is a modular portable energy system which addresses the foregoing needs.

SUMMARY OF THE INVENTION

The present invention relates to modular portable energy systems and associated equipment. In a first embodiment, the modular portable energy system is in the form of a personal solar kit that includes a flexible solar panel, a power module in electrical communication with the flexible solar panel, one or more appliance kits in electrical communication with the power module via one or more distribution components, and a carrying unit of a sufficient size to contain at least one of the power module, the one or more distribution components, and the one or more appliance kits. The carrying unit can have many different shapes and sizes, and could be tubular in shape and comprises a central subcontainer positioned between a bottom subcontainer and a top subcontainer. The carrying unit could also be much larger, such as a suitcase. Additionally, a carrying retainer having an integral handle can be provided, and wrapped around the flexible solar panel to retain same for storage/transportation. The flexible solar panel could be foldable and tent poles could be utilized to support the flexible solar panel when in use.

In a second embodiment, the modular portable energy system comprises a portable shelter system with power generation capabilities comprising a portable and collapsible (or popup) structure having a top portion and a solar panel system attached to the top portion of the structure. The portable structure may be in the form of a tent, umbrella, gazebo, awning, lean-to, lamp, etc., and could have one or more power access points dispersed throughout, with each access point in electrical communication with the solar panel system. The solar panel system could be removably attached to the top portion or embedded in the fabric of the top portion, or at other locations. Specifically, the solar panel system could comprise a unitary removable solar attachment, or a plurality of flexible radially arrayed flexible solar panels suspended from a support frame, configured to correspond to the geometry of the top portion of the portable structure. A carrying unit of sufficient size to contain the structure and the solar panel system can be provided.

In a third embodiment, the modular portable energy system comprises an alternative power generation system that includes a transducer and/or human electricity harvesting device for generating electrical power. A power unit is coupled to the transducer or harvesting device and has circuitry for processing the electrical power generated and storing the electrical power in a battery within the power unit. The system could also include a plurality of distribution components in electrical communication with the power unit and a plurality of devices to be electrically powered, such as wireless devices, video, kitchen appliances, light, cellphone, or a battery charger.

In a fourth embodiment, the modular portable energy system comprises a thin, multi-layered solar power generation device and includes a substrate, a first layer formed on the substrate including battery electronics therein, a second layer formed on the first layer including a circuit having power electronics therein, and a third layer formed on the second layer including photovoltaic materials for generating electricity. The layers could be laminated, printed using conductive inks, and/or have interstitial wiring in between.

In a fifth embodiment, the modular portable energy system comprises an energy network system where any of the previous embodiments could be networked to share power amongst a plurality of power consuming devices. Each system in the network could have a power module or the entire network could have one power module shared among the systems. Any of the previous embodiments could further comprise wireless devices in electrical communication with the system. Also, any of the previous embodiments could be used with one or more appliance kits in electrical communication with the system via distribution components.

BRIEF DESCRIPTION OF THE DRAWINGS

The foregoing features of the invention will be apparent from the following Detailed Description of the Invention, taken in connection with the accompanying drawings, in which.

DETAILED DESCRIPTION OF THE INVENTION

The present invention relates to a modular portable energy system, as discussed in detail below in connection with FIGS. 1-21.

Figure 1:
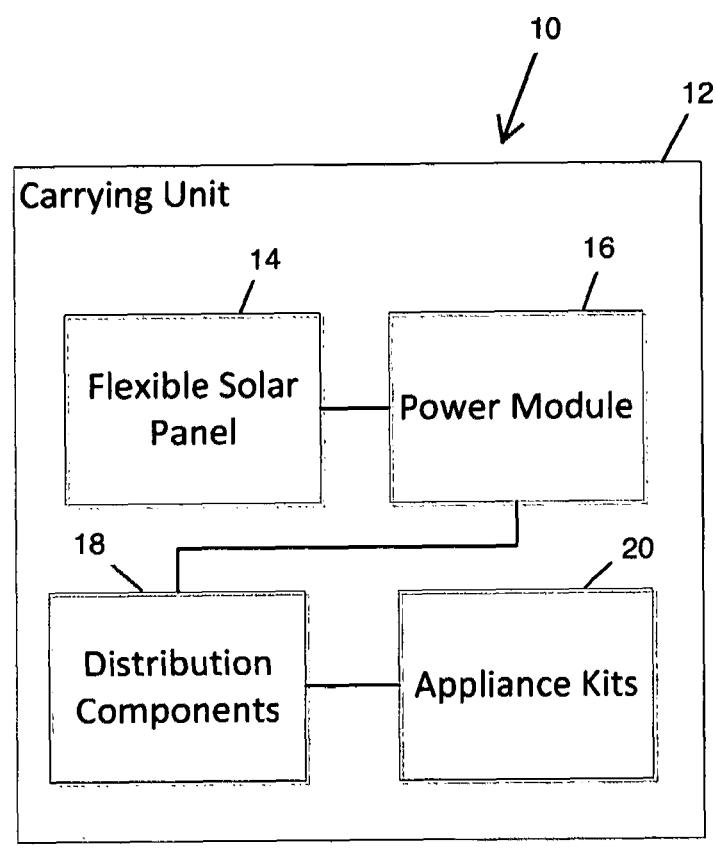
FIG. 1 is a diagram showing a first embodiment of the modular portable energy system comprising a personal solar kit.

FIG. 1 is a diagram showing a first embodiment of the modular portable energy system comprising a personal solar kit 10. As shown, the personal solar kit 10 includes a carrying unit 12 containing a flexible solar panel 14, a power module 16, one or more distribution components 18 (e.g., a plurality, for example, of 5-15), and one or more appliance kits 20. In use, the flexible solar panel 14 generates electrical energy stored in the power module 16 which is connected to, and provides power to, one or more appliance kits 20 via one or more distribution components 18. As discussed in greater detail below, the power module 16 includes a rechargeable battery (charged by the flexible solar panel 14) and associated power electronics operating at and providing, for example, but not limited to, 12 volts of electricity.

Figure 2:
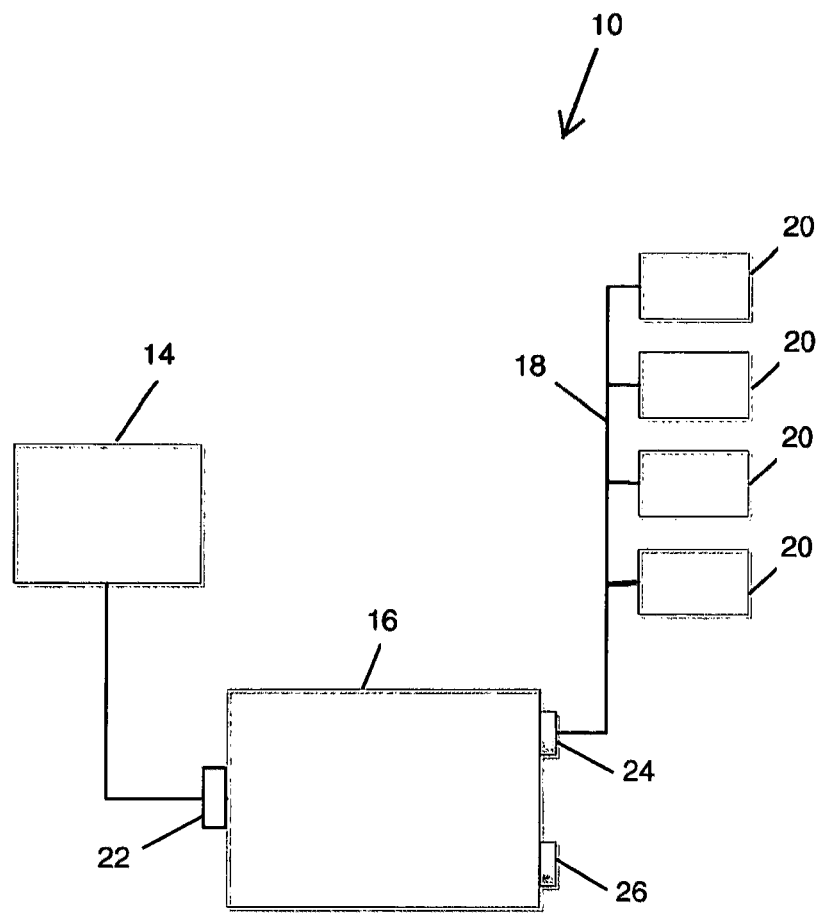
FIG. 2 is a diagram showing the personal solar kit 10 of FIG. 1 in greater detail.

FIG. 2 is a more detailed diagram of the personal solar kit 10 of FIG. 1 showing the flexible solar panel 14 connected to a solar panel input 22 of the power module 16. Appliance kits 20 are in communication with a distribution component output 24 of the power module 16 via distribution components 18, where the power module is capable of providing, for example, 12 volts of electricity. The power module has a modular expansion port 26 for connecting to other systems 10 to create a network of such systems, as later shown and described in more detail.

Figure 3:
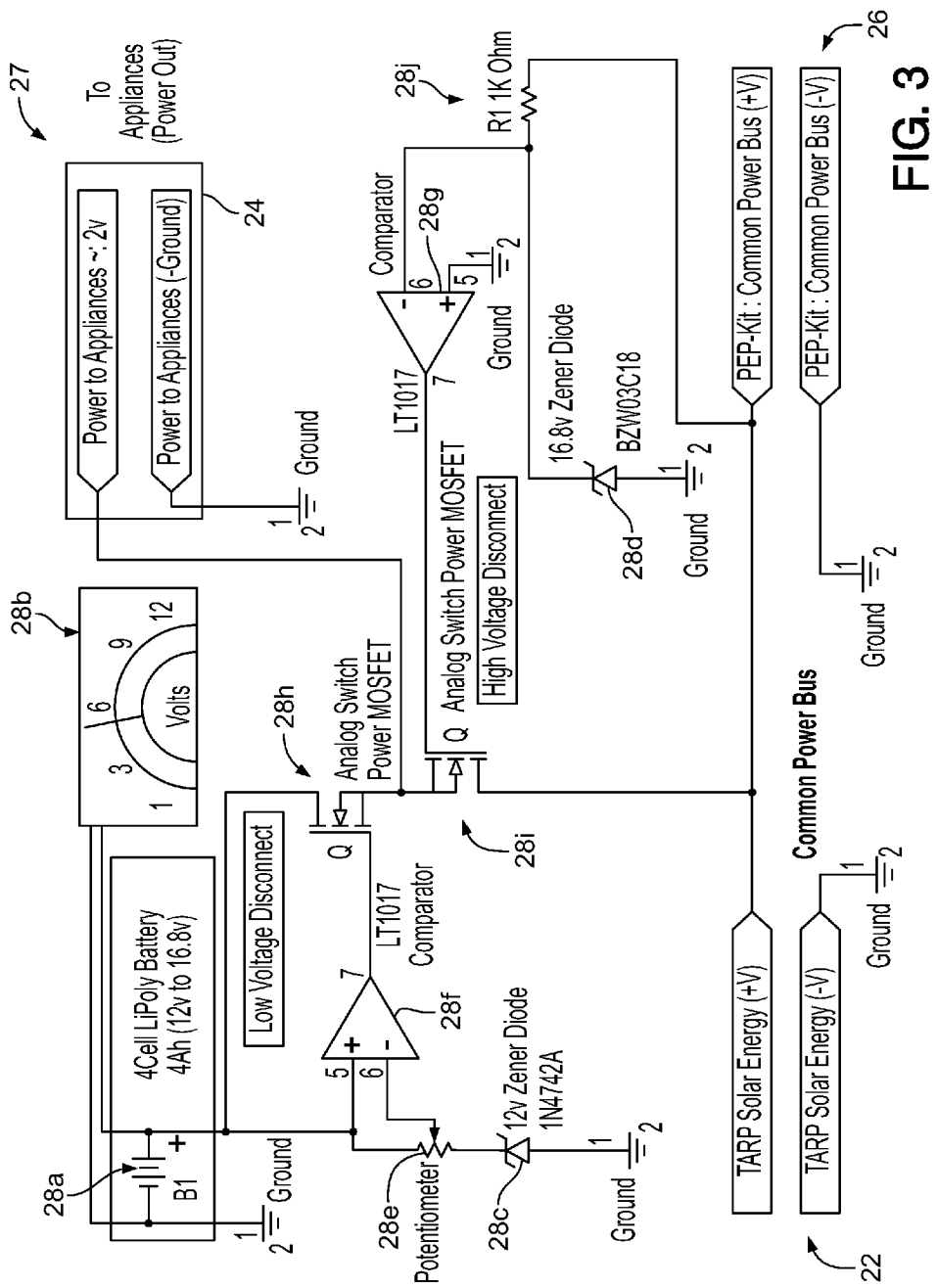
FIG. 3 is an electrical schematic showing electrical components of the power module of FIGS. 1-2.

FIG. 3 shows a circuit 27 of power module 16 of FIGS. 1-2 including the solar panel input 22, the distribution component output 24, and the modular connection port 26. As shown, the circuit 27 includes a rechargeable lithium-ion polymer battery 28a which operates at about 4 Amperes/hour and about 12-16.8 volts, provide about 13 watts, and be fully charged when the flexible solar panel is exposed to the sun for about 12 hours. Additionally, if two or more units are connected together, the total wattage output could be increased (e.g., if six power modules are networked together the total output would be in the area of approximately 98 watts). Of course any suitable battery 28a could be used, such as lithium-ion, alkaline, nickel-cadmium, and nickel metal hydride. Additionally, the operating parameters provided are only exemplary and the battery 28a could operate at any other suitable parameter. The battery stores power during time periods of little or no sunlight, or when a system's power generation is greater than the power use.

The circuit 27 also comprises a volt meter 28b displaying wattage, amperage, and/or other electrical parameters, and is analog or digital. Further, the circuit 27 comprises a number of electronic components, discrete and/or integrated, including diodes 28c, 28d, a potentiometer 28e, comparators 28f, 28g, transistors 28h, 28i, and resistors 28j. Such electronic components could include a 12 volt Fairchild semiconductor Zener diode 28c, a 16.8 volt Vishay Siliconix Zener diode 28d, Linear Technology micropower dual comparators 28f, 28g, high voltage and/or low voltage analog switch power metal-oxide-semiconductor field-effect transistors (MOSFET), and a 1000 Ohm resistor 28j. As these electronic components are only exemplary, any manufacturer or suitable type of diode, comparator, transistor, or resistor could be used, and additionally, the specifications of such components could be varied as desired.

The power module 16 and circuit 27 can perform one or more of the following functions: control uniform, fast, and safe charging of the battery; cycle the display of state of charge of the battery; detect and prevent overcharging; enable user selectable display of LEDs; detect minimum allowed battery voltage and prevent discharge below that level; detect overheating during both charge and discharge cycles; disable battery charging when heat or charge levels are inconsistent with battery specifications; change solar panel voltages to match battery module charging requirements and appliance discharge requirements; prevent damage to solar panel by preventing excessive current backflow; and prevent excessive current between power modules. Additionally, the power module could utilize meters and LEDs to display information, such as by using LEDs to display the state of charge of the battery.

Figure 4A:
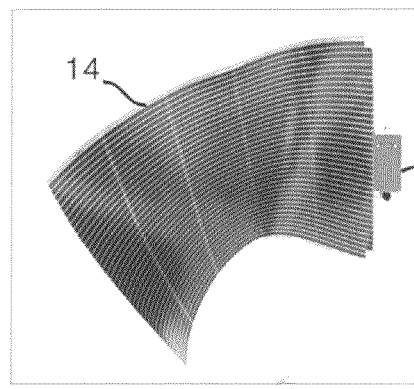
FIGS. 4A-4C are views showing the personal solar kit 10 in greater detail, including a carrying retainer with an integral handle with a pouch.
Figure 4B:
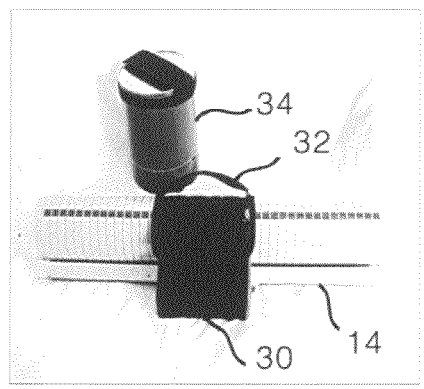
Figure 4C:
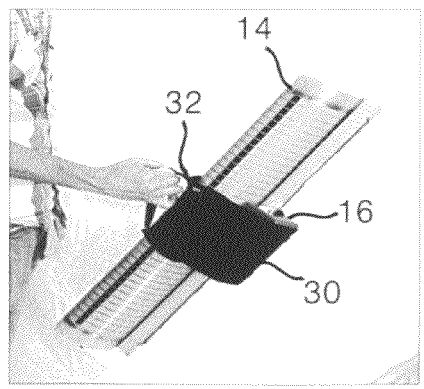

Shown in FIGS. 4A-4C are views of the personal solar kit 10 in greater detail. FIG. 4A depicts the flexible solar panel 14 and power module 16 of the present invention. The flexible solar panel 14 rolls up into a compact cylindrical shape. Examples of flexible solar panels 14 that could be used with the present invention include those provided by Konarka, Ascent, UniSolar, or PowerFilm, or any other suitable manufacturer. It is also anticipated that the flexible solar panel 14 could be rigid or foldable, such as those provided by SunForce, PowerFilm, or Brunton. As shown in FIGS. 4B-4C, the flexible solar panel 14 could be rolled up and secured within a carrying retainer 30 having a handle 32, where the carrying retainer 30 is wrapped around the flexible solar panel 14. The carrying retainer 30 could include a pouch to hold the distribution components 18, and a canister 34 could also be provided. For example, the flexible solar panel 14 is made of weather proof Power Plastic, bendable to a two inch radius, 27×44 inches, 0.97 pounds, produces up to 22 volts, 0.8 amps, and 13 watts under a full bright sun and no load. Of course, other panels could be used, if desired.

Figure 5A:
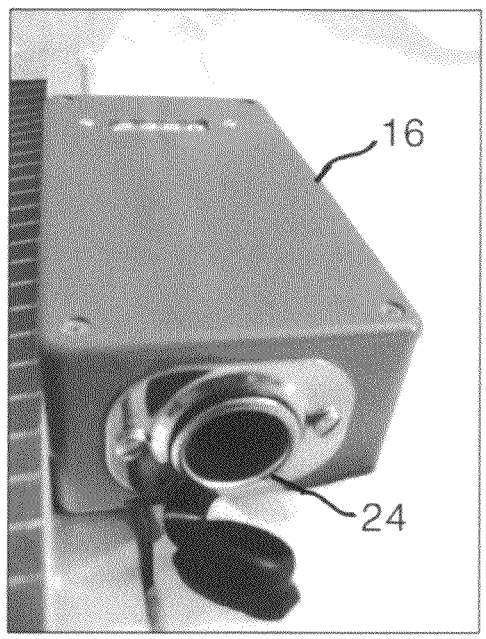
FIGS. 5A-5C are views showing the power module and power distribution components of FIGS. 1-2 in greater detail.
Figure 5B:
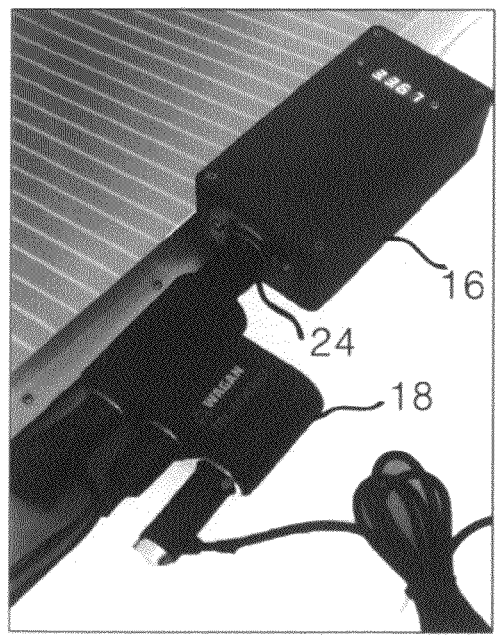
Figure 5C:
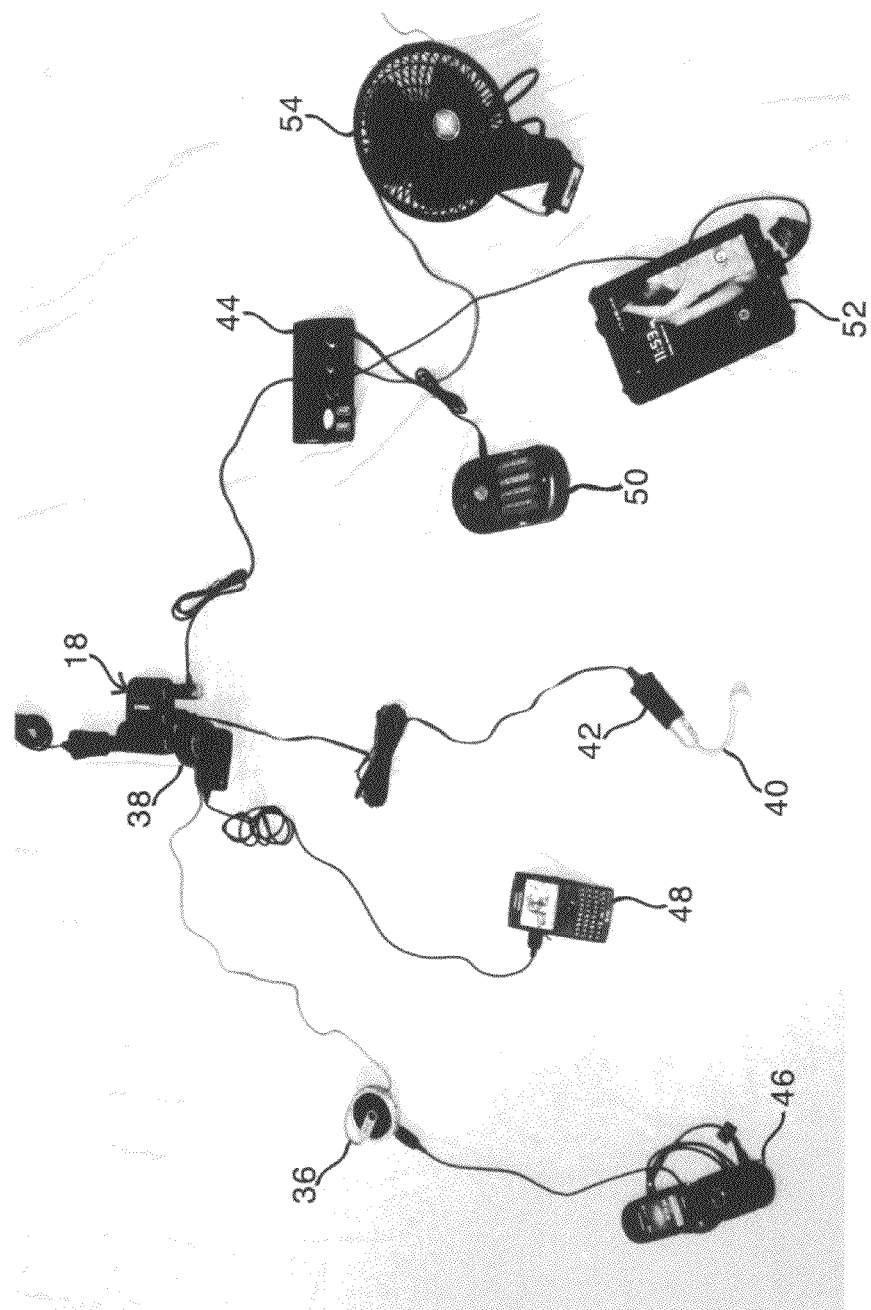

FIGS. 5A-5C are views showing the power module 16 and power distribution components 18 in greater detail. FIGS. 5A-5B show the power module 16 with distribution component output 24 and distribution components 18 connected thereto, where the power module 16 provides, for example, 12 volts of electricity. FIG. 5C shows a variety of appliance kits 20 connected to the distribution components 18. As shown, the distribution components 18 of FIG. 1 include USB hub 36, 12 volt socket adapter 38, cabling expansion 42, and 12 volt socket/USB combination power hub 44. Also as shown, appliance kits 20 of FIG. 1 include a light 40, cellphone 46, a smartphone 48, a battery charger 50, a tablet computer 52, and a fan 54. Of course, other appliances could be provided, depending upon the application, e.g., survival, recreation, military, or technological applications. The power module could be of various sizes depending on the type of usage required, such as heavy duty, medium duty, or lightweight. For example, an ultra-lightweight kit could provide sufficient power for 3 days, a lightweight kit could provide power for 10 days, and a midweight kit could provide power for 3 weeks.

Figure 6A:
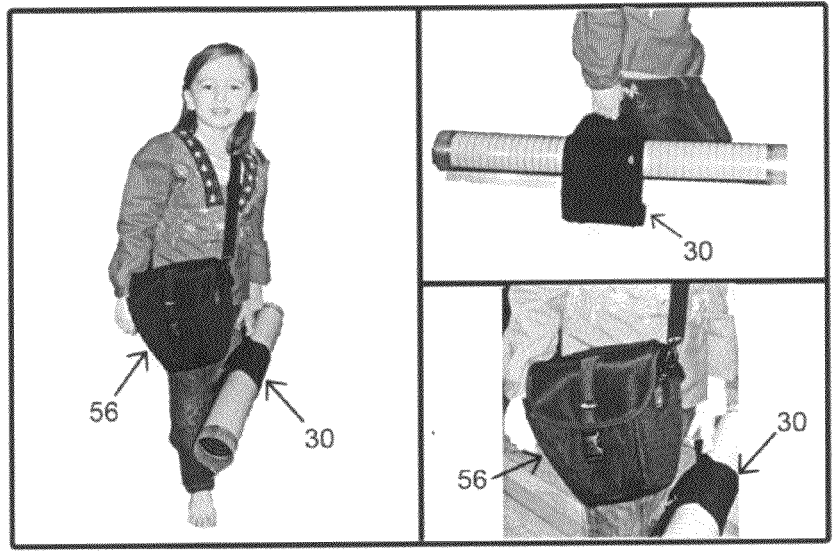
FIGS. 6A-8D are views showing the personal solar kit of the present invention in greater detail.
Figure 6B:
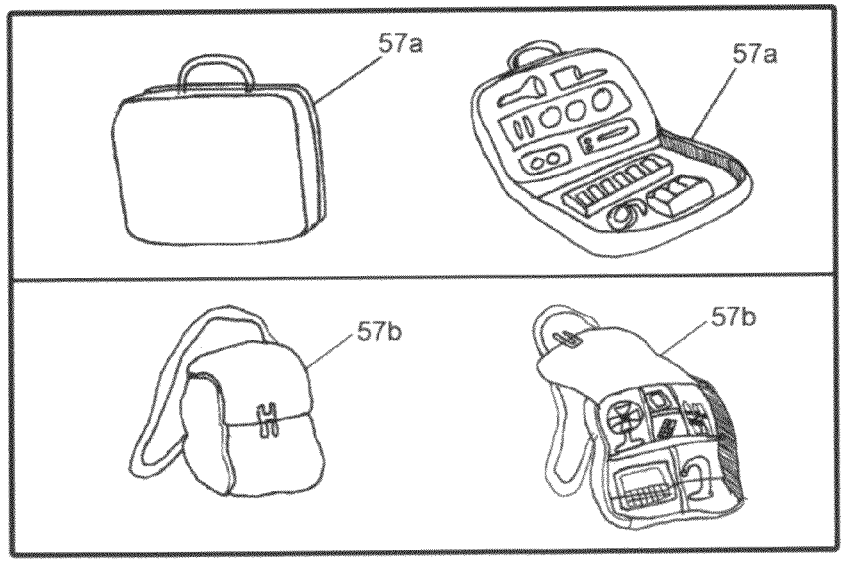

Shown in FIGS. 6A-8D are various embodiments of the personal solar kit with carrying unit 12 or carrying retainer 30. The carrying unit could be waterproof and made of nylon or other suitable material. The sizes of the carrying unit 12 will depend on the length of the trip and the number of appliance kits 20, and any other materials that may be required. In one embodiment, the system, as shown in FIG. 6A, includes a lightweight pouch 56, which may be best suited for daily use or short trips. Shown in FIG. 6B are further embodiments of the personal solar kit comprising a computer case 57a or backpack 57b, which are intended for longer trips and to store appliances kits 20 or other supplies.

Figure 7A:
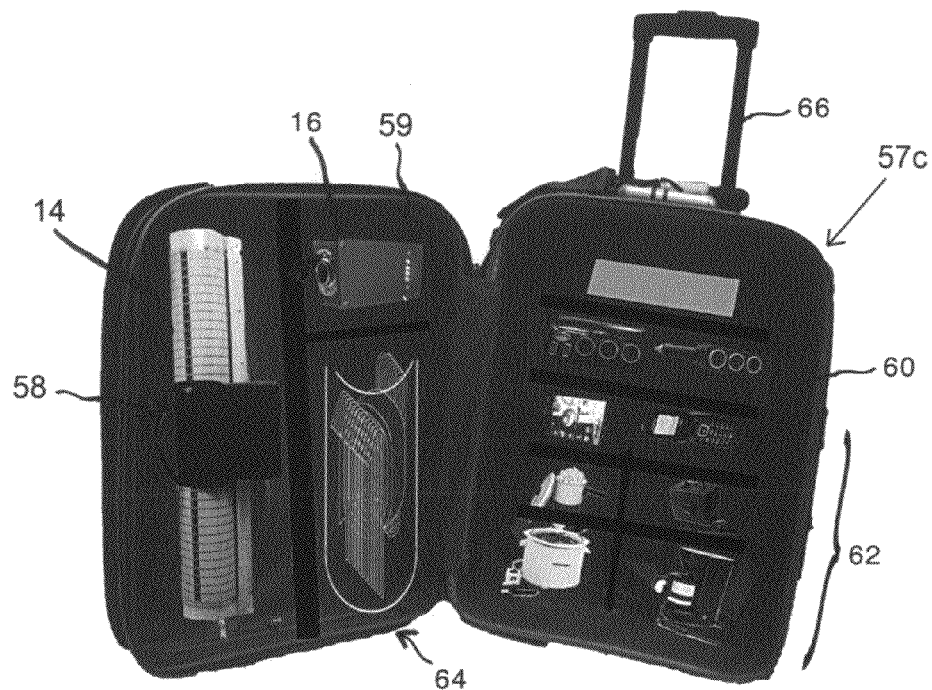
Figure 7B:
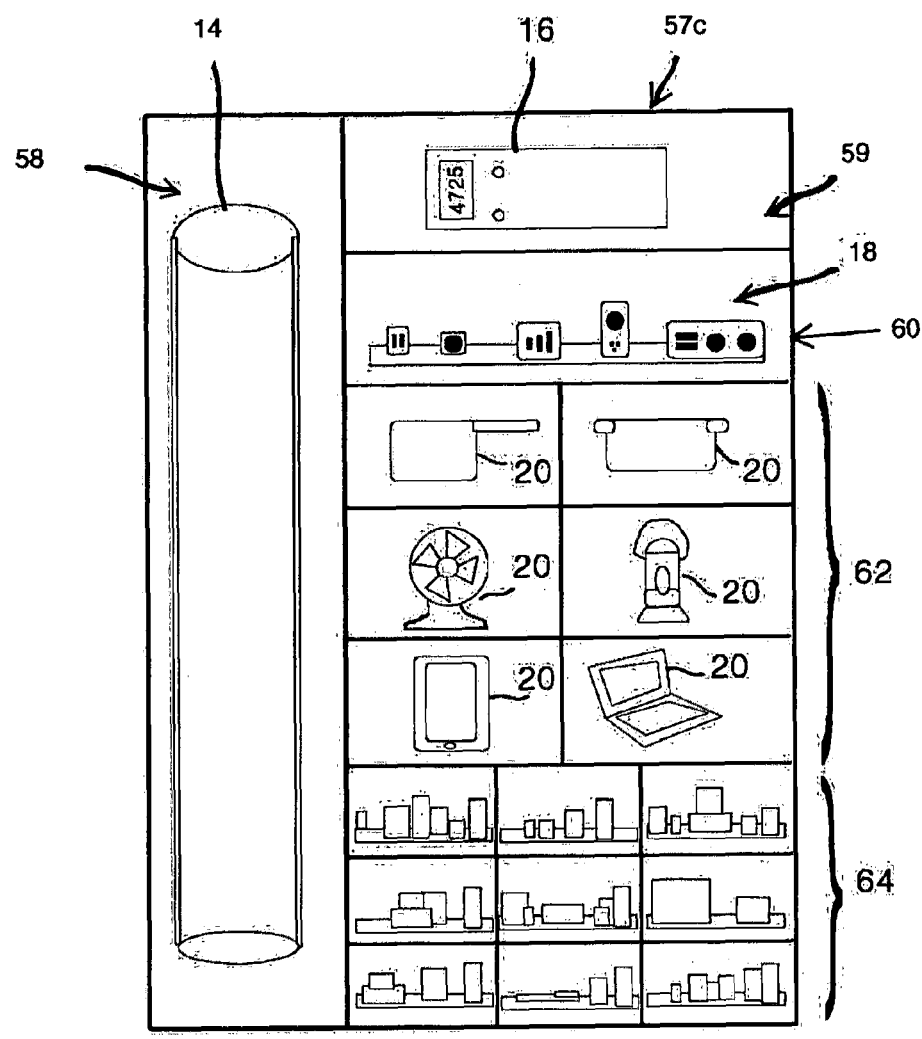

Referring to FIGS. 7A-7B, one embodiment of the carrying unit is shown, although the figures are not to scale and are for illustrative purposes only. The carrying unit 57c comprises solar panel subcompartment 58 containing flexible solar panel 14, power module subcompartment 59 containing power module 16, distribution component subcompartment 60 containing distribution components 18, appliance kit subcompartments 62 containing appliance kits 20, as well as other subcompartments 64 for general usage. The carrying unit 57 also comprises a retractable handle 66. This carrying unit 57 is larger than the lightweight pouch 56 and thus can hold more material and appliance kits 20 for longer trips.

Figure 8A:
Figure 8B:
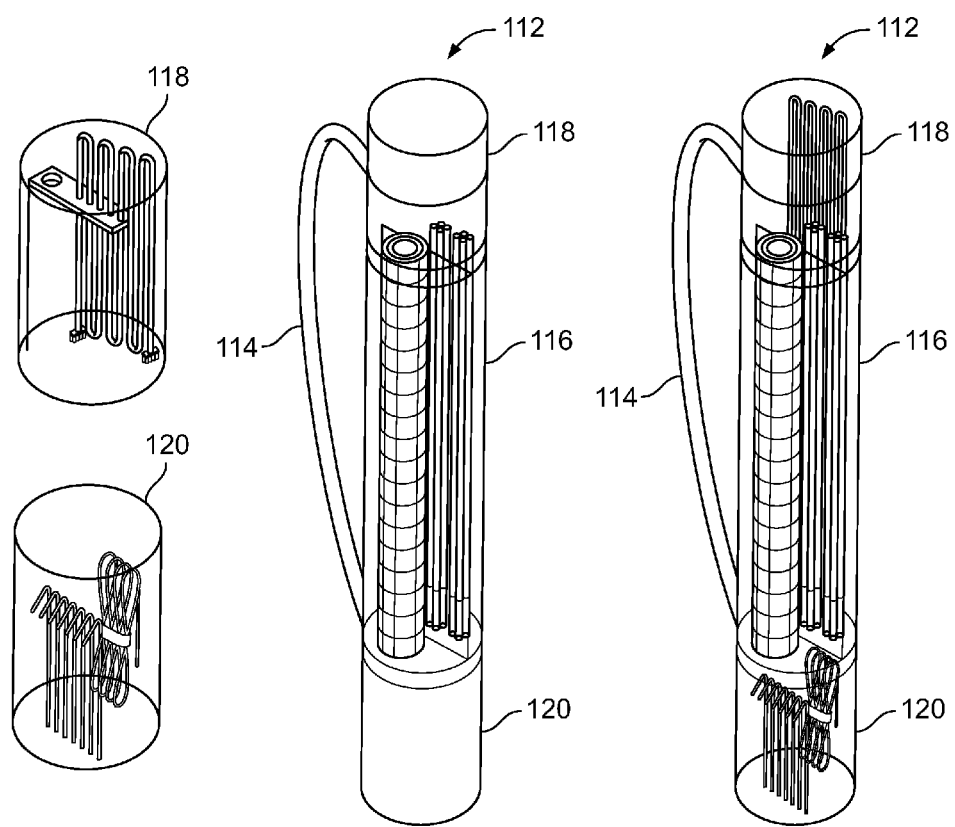
Figure 8C:
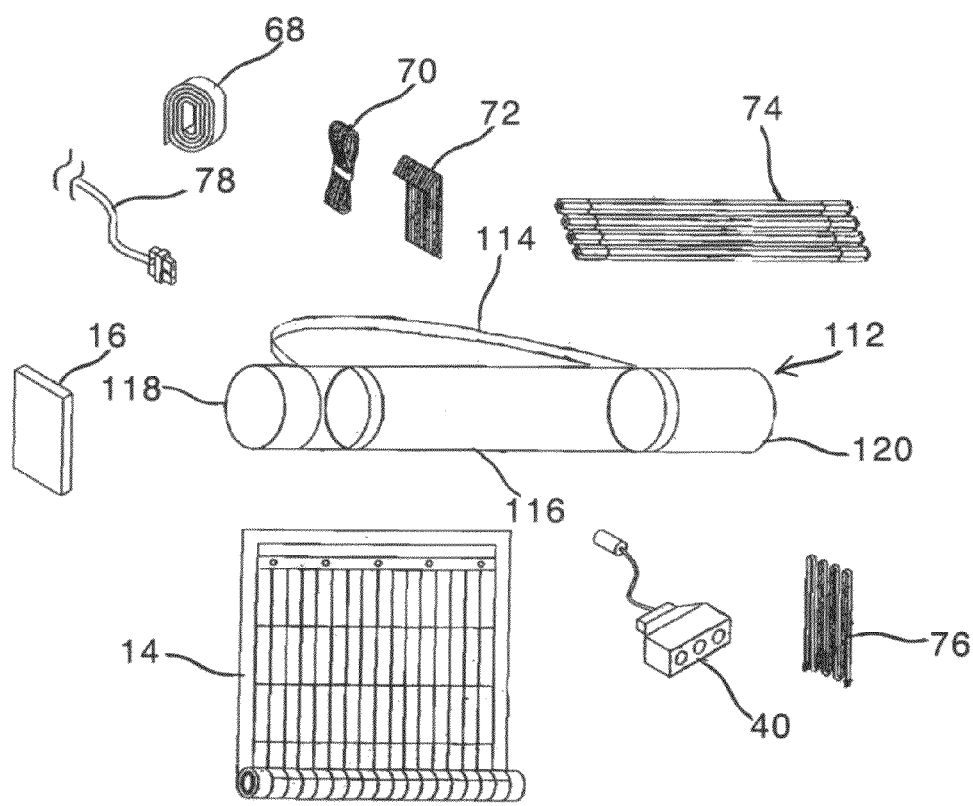
Figure 8D:
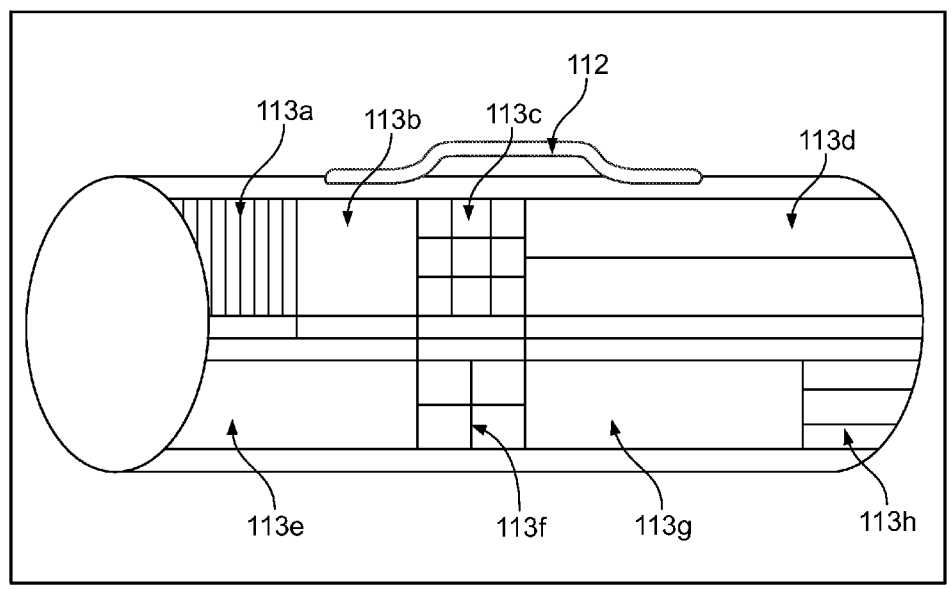

Referring to FIGS. 8A-8D, another embodiment of the carrying unit is shown. As shown in FIG. 8A, a duffel bag 122, or any other suitable container, could be used with the carrying unit 112 to hold extra distribution components 18, appliance kits 20, or any other components or devices. As shown generally in the assembled view of FIG. 8B and the exploded view of FIG. 8C, the carrying unit 112 is tubular in shape and comprises a strap 114 and a central subcontainer 116 positioned between a top subcontainer 118 and a bottom subcontainer 120. The carrying unit 112 and subcontainers 116, 118, and 120 contain a flexible solar panel 14, power module 16, socket splitter 40, electrical wire 76, plug 78, and a variety of components for supporting and positioning the flexible solar panel, such as industrial Velcro 68, cord 70, ground stakes 72, and poles 74. FIG. 8D is a general view of the carrying unit 112 comprised of subcompartments 113a-113h which contain and organize various components and devices of the present invention.

Turning now to FIGS. 9-15F, the second embodiment of the present invention, relating to a portable shelter system with power generation capabilities, will now be described.

Figure 9:
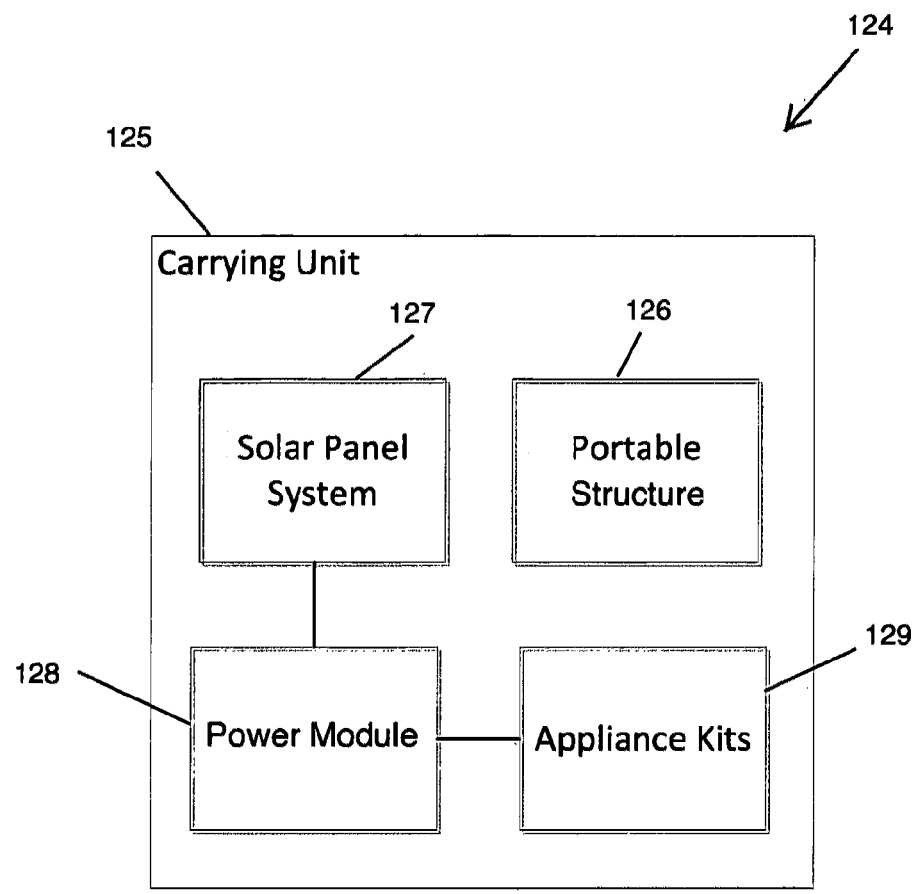
FIGS. 9-15F are views showing various possible configurations of a second embodiment of the present invention, which provides a portable shelter system with power generation capabilities.

Referring to FIG. 9, shown generally is the portable shelter system 124 with power generation capabilities comprising carrying unit 125 containing portable structure 126, solar panel system 127, power module 128, and appliance kits 129. The portable shelter system 124 has various possible configurations that include a variety of portable and collapsible (or popup) structures, such as umbrellas, tents, awnings, and lean-tos.

FIG. 10A-10D show unitary removable solar attachments 132, 142 configured to match the geometry of a top of a portable structure such as a lamp or an umbrella. The top of the portable structure is one of a variety of shapes, such as a square, hexagon, or octagon. The unitary solar attachments 132, 142 are preferably a flexible copper solar panel, although other materials, including more rigid materials, could be used. When used with a lamp 134, as in FIG. 11A, the solar attachment 132 would preferably charge a battery during the day, which would then power the lamp 134 at night.

Figure 10A:
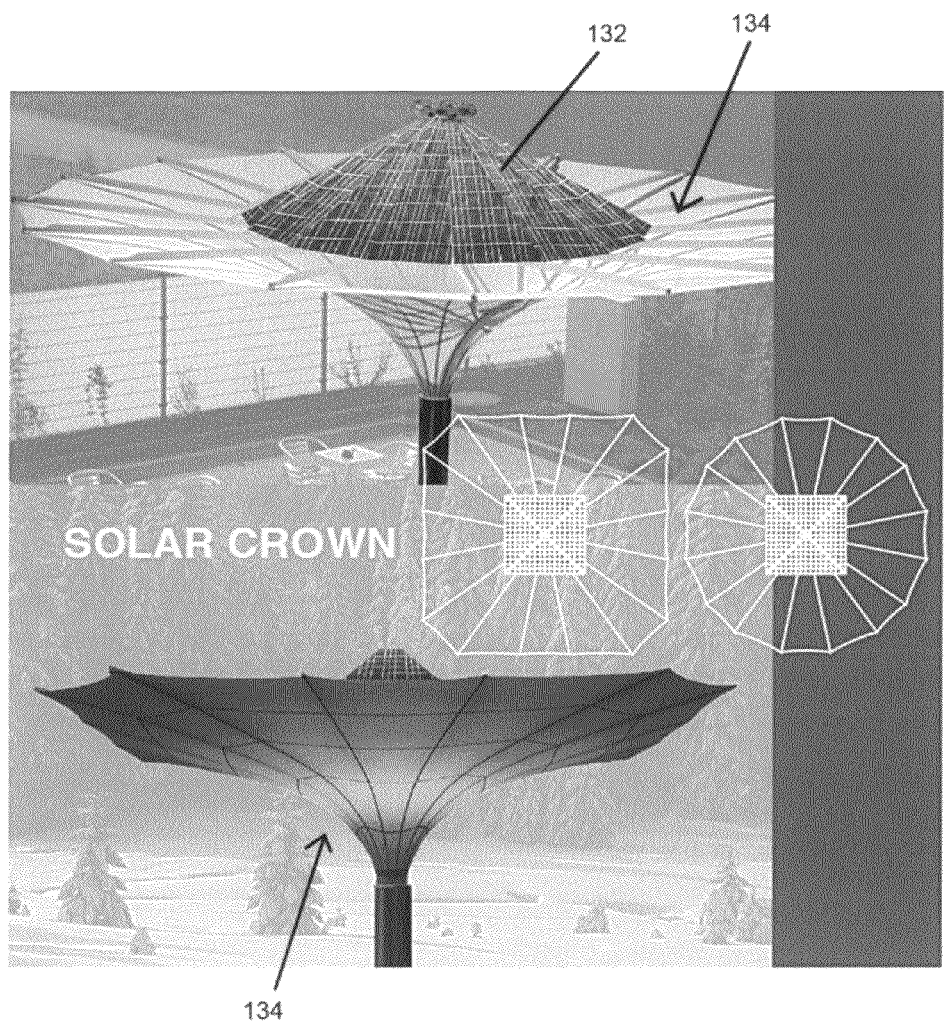
Figure 10B:
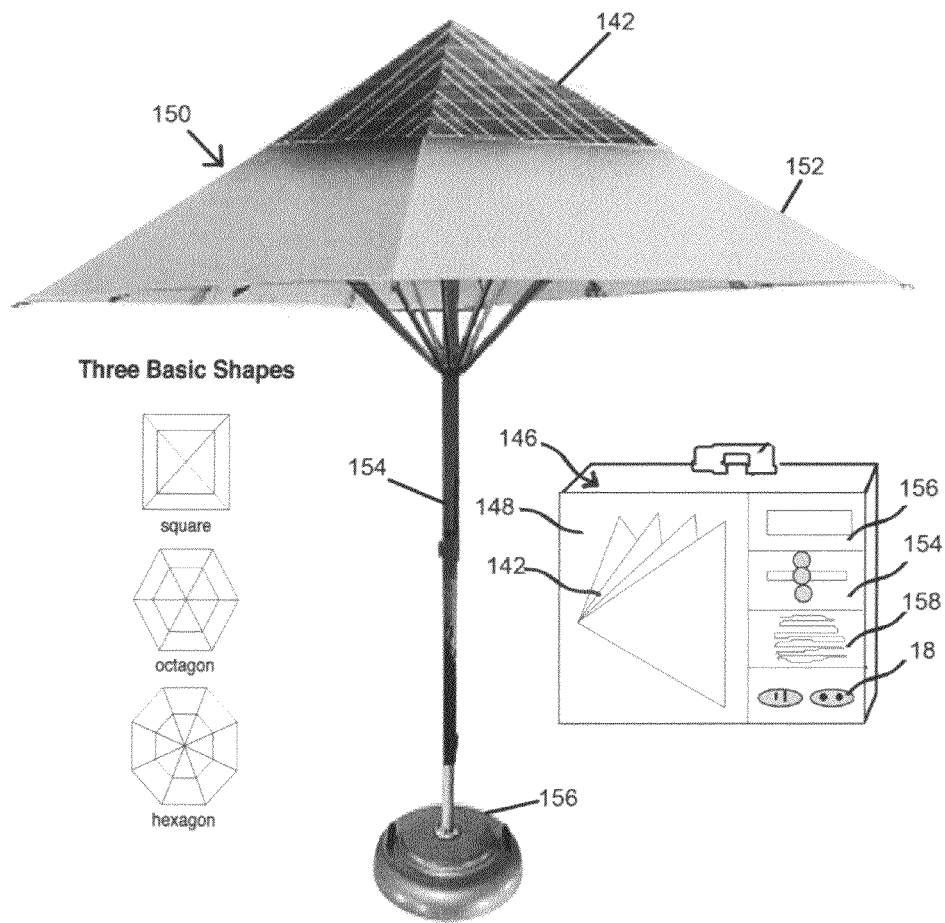
Figure 10C:
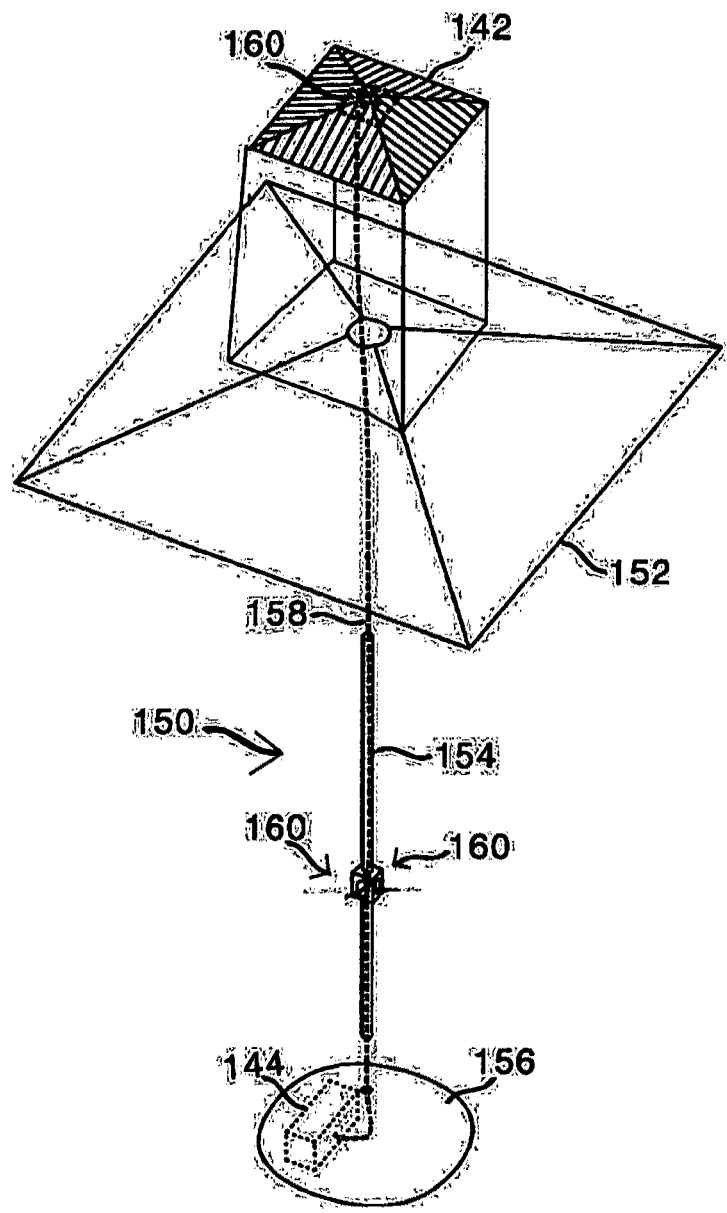
Figure 10D:
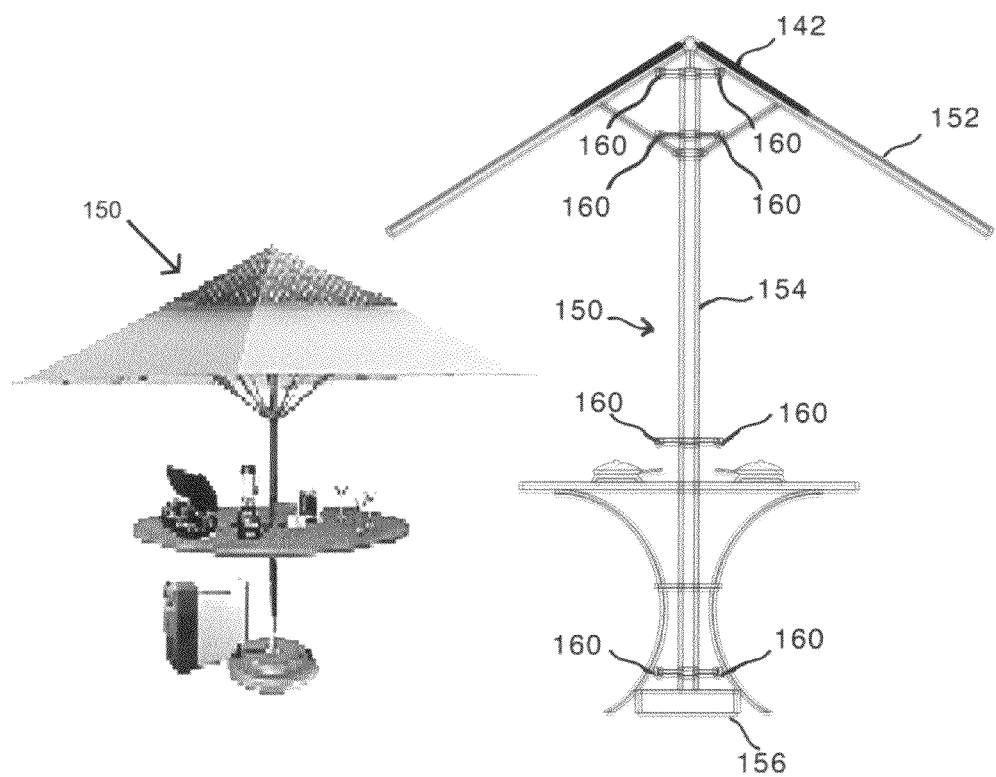

FIGS. 10B-10D show a portable shelter system 150 with power generation capabilities, comprising a unitary solar attachment 142 used with an umbrella comprising a top 152, a pole 154, and a stand 156. A power module 144 could be located within the stand 156 and connected to the solar attachment 142 via wiring 158 running from the stand 156 through the interior of the pole 154 and to the top 152. The umbrella could comprise one or more power access points 160, or power outlets, dispersed throughout allowing a user to connect and power an electronic device. The umbrella is collapsible (or popup) and thereby easily transportable with the solar attachment 142. As a result, the portable shelter system 150 and umbrella may be part of a kit 146 which includes a carrying case 148 capable of housing the solar attachment 142 and at least parts of the umbrella, among other things.

Figure 11A:
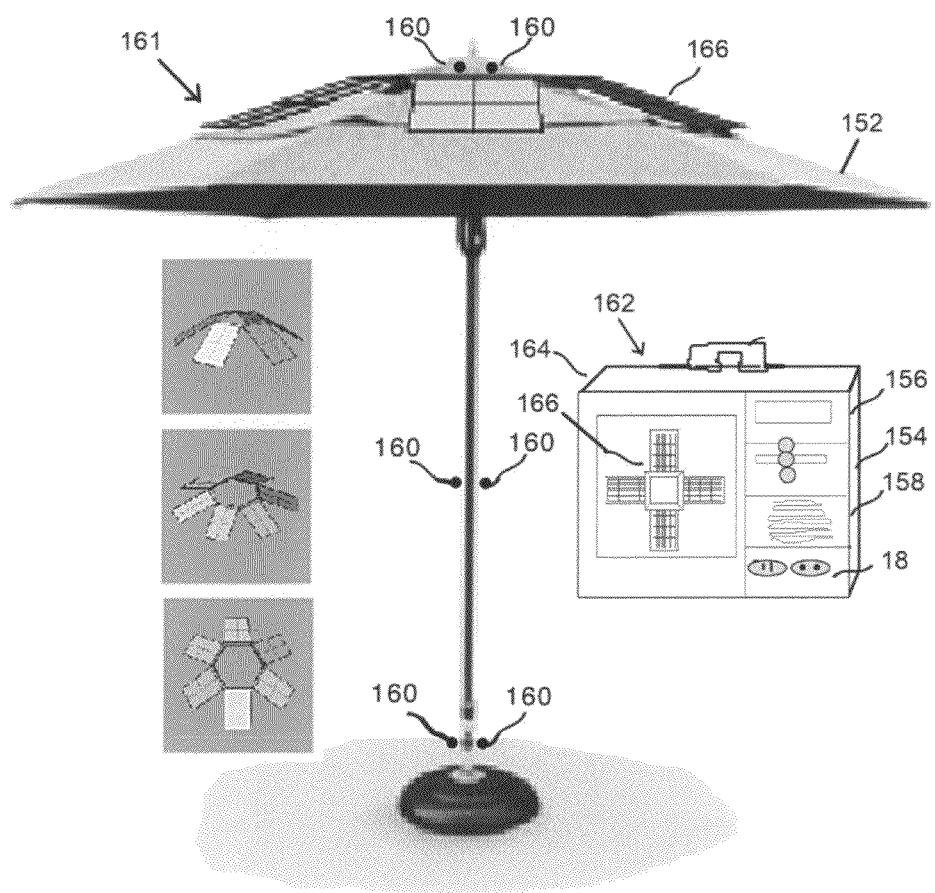
Figure 11B:
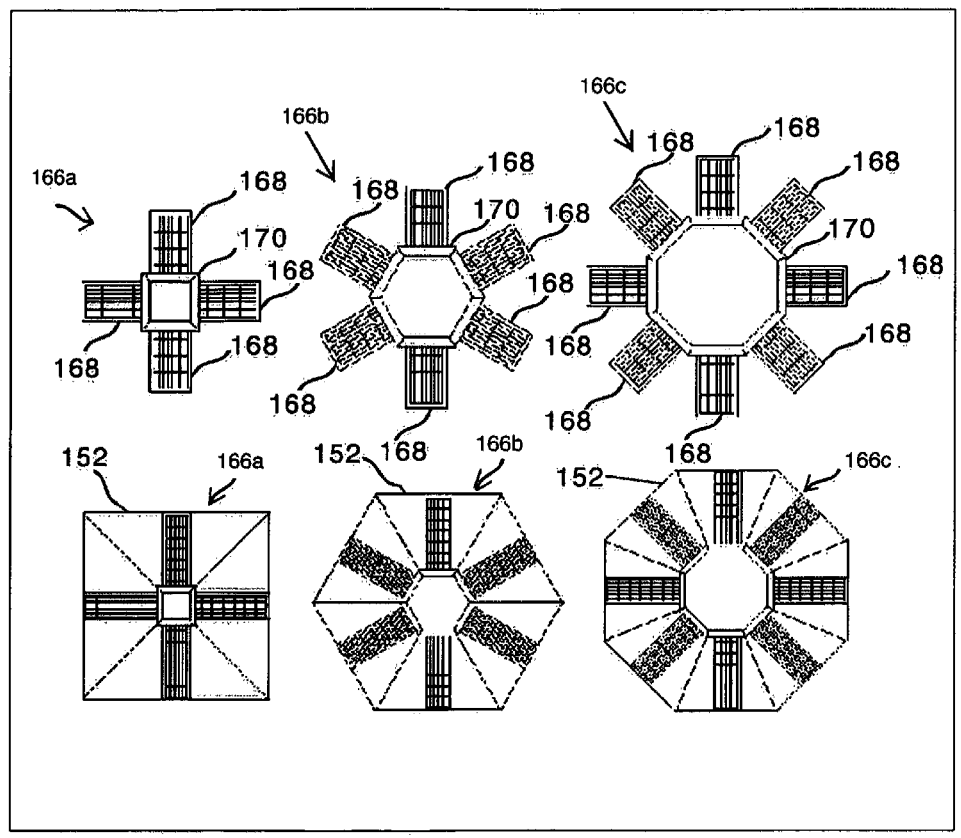

FIG. 11A-11B is a portable shelter system 161 with power generation capabilities comprising a removable solar attachment 166 having a plurality of flexible solar panels 168 radially arrayed and suspended from a support frame 170. The support frame 170 is rigid or flexible and configured to fit the top 152 of an umbrella. The unitary solar attachment 142 of FIGS. 10A-10D could be used in combination with the radially arrayed solar attachment 166. As with the previous embodiments, the solar attachment 166 could be part of a kit 162 comprising a carrying case 164. The solar attachment 166 could have any number of solar panels and be one of a variety of shapes, such as a square solar attachment 166a, a hexagonal solar attachment 166b, and an octagonal solar attachment 166c.

Figure 12A:
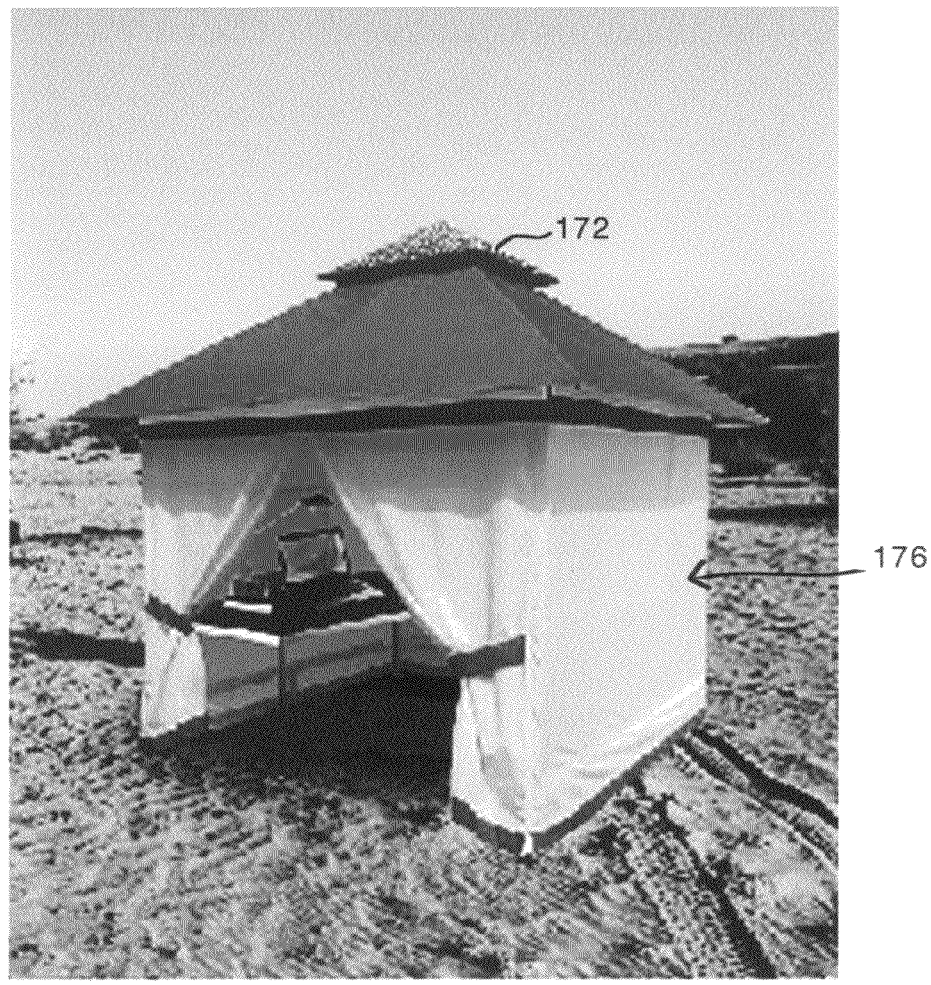
Figure 12B:
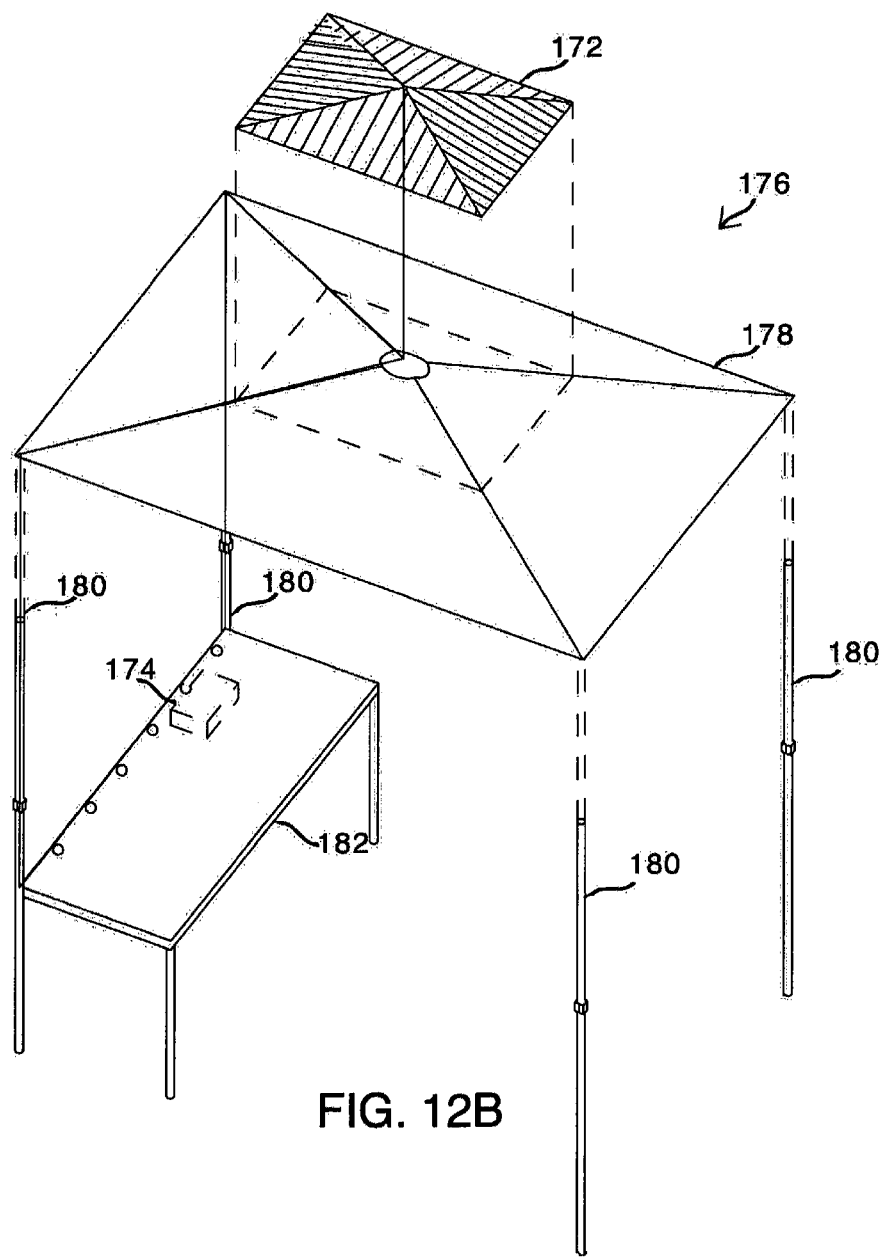
Figure 12C:
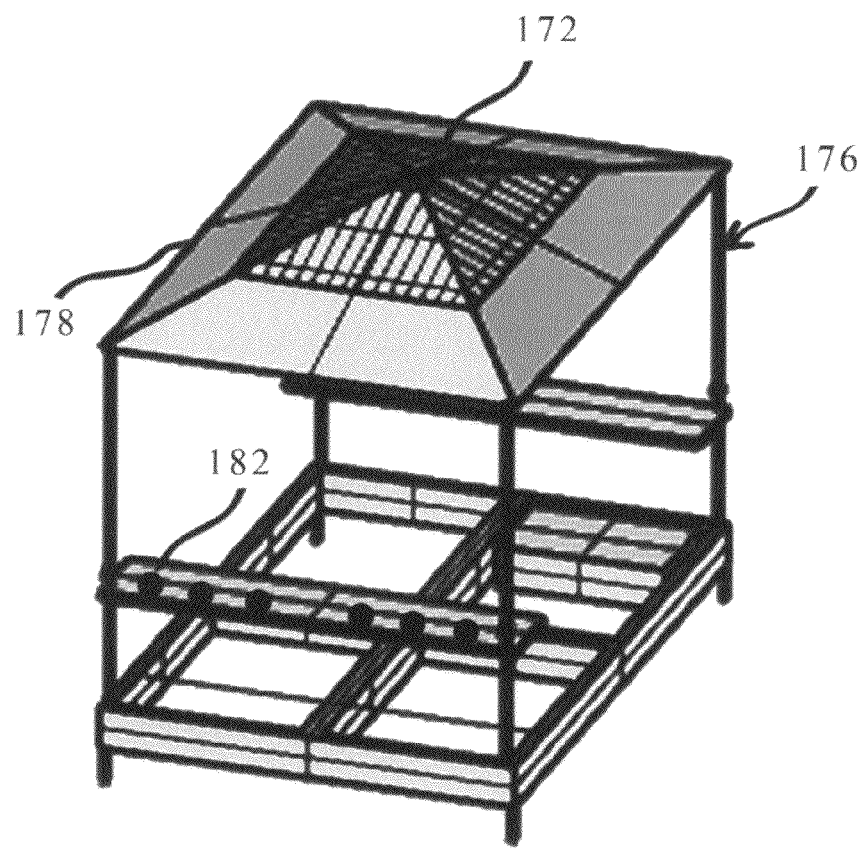

FIGS. 12A-12C are views of a portable shelter system 176 with power generation capabilities comprising a unitary solar attachment 172 applied to a tent. The solar attachment 172 connects to a power module 174 and is shaped to attach to the top 178 of a tent having a plurality of poles 180. Preferably, the tent also further comprises one or more tables 182 and the power module 174 is stored underneath the table 182. Although a tent is specifically mentioned, it should be appreciated that the present invention could be used with any number of structures including gazebos and pavilions.

Figure 13:
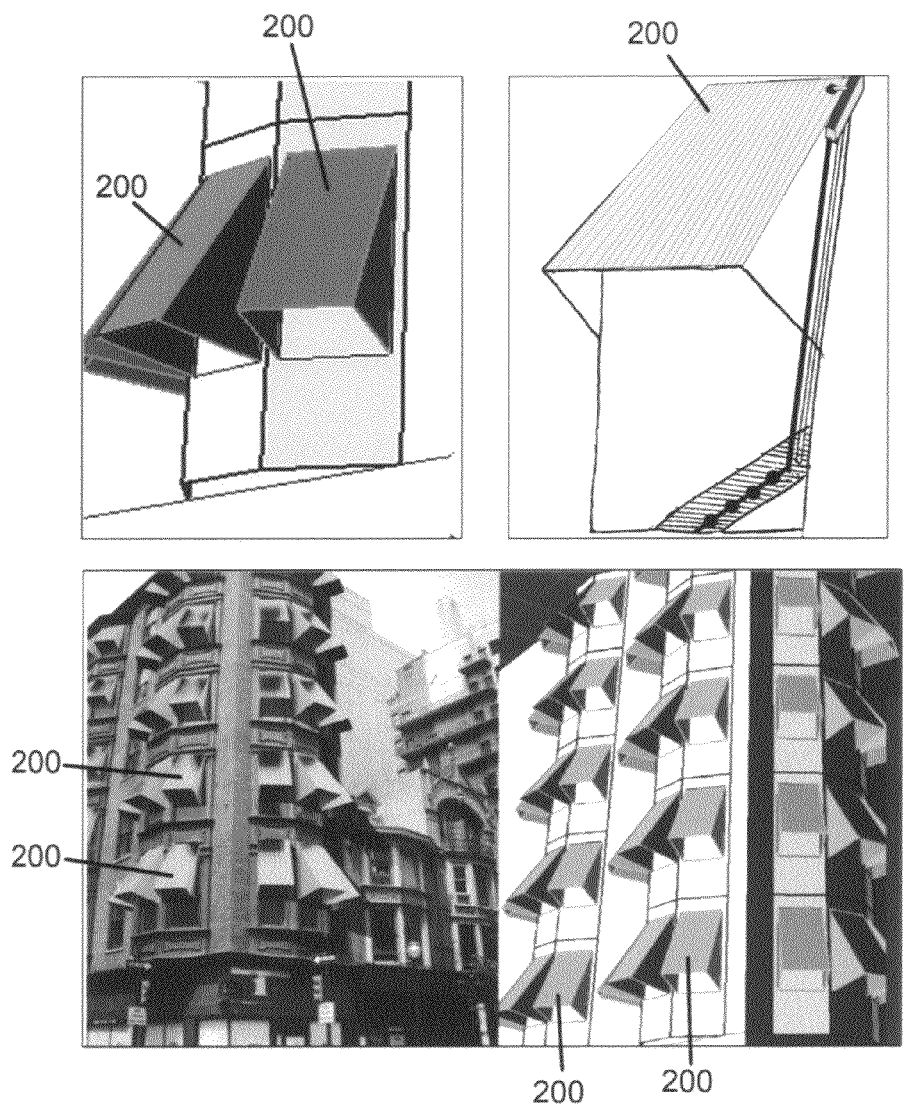
Figure 14:
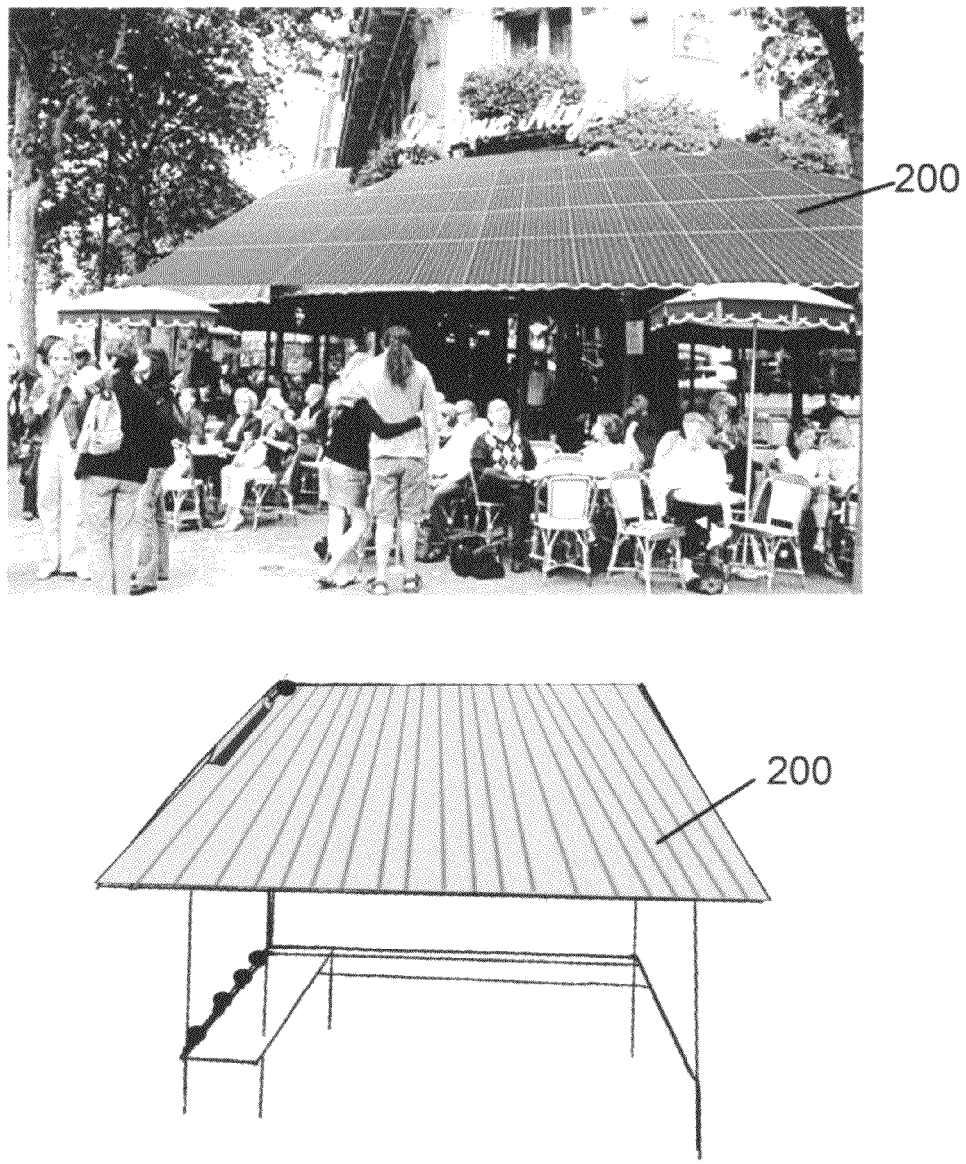
Figure 15A:
Figure 15B:
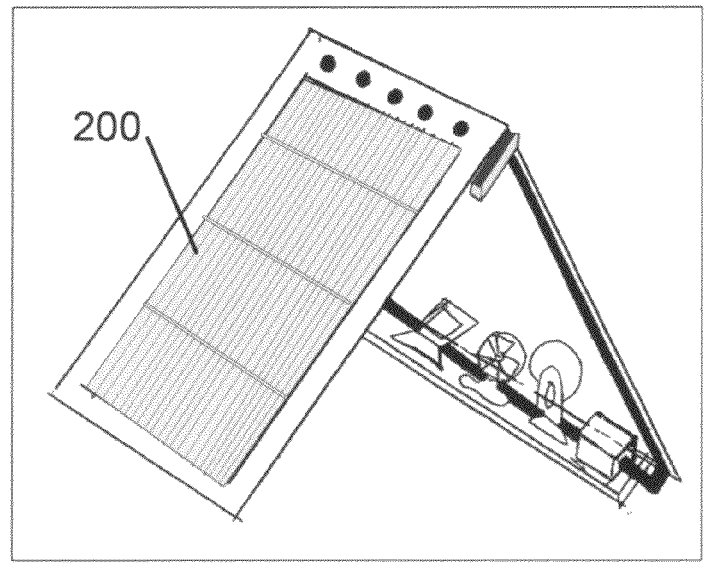
Figure 15C:
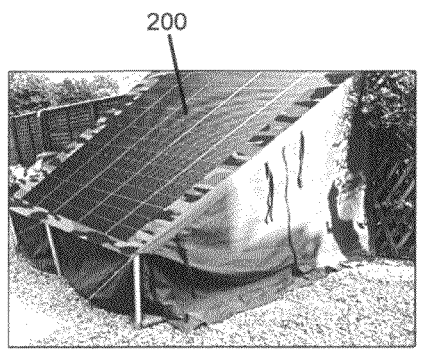
Figure 15D:
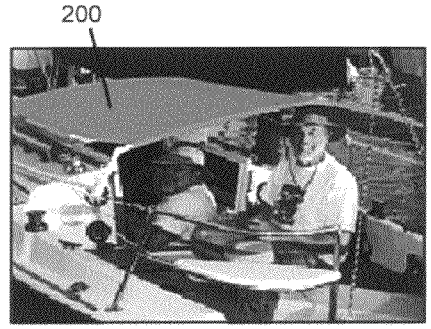
Figure 15E:
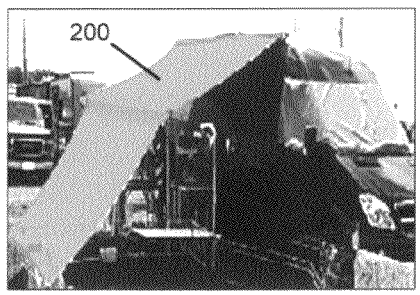
Figure 15F:
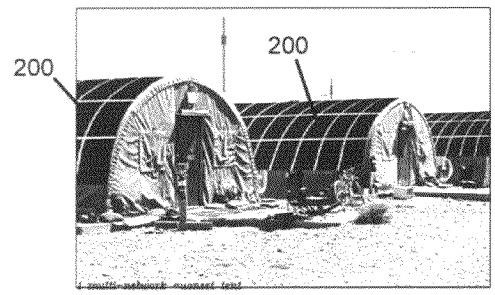

FIGS. 13-15F show a variety of applications of solar energy system 200 of the present invention applied to other structures. Specifically, FIGS. 13-14 show the present invention applied to awnings. The awnings could be retractable or collapsible and the solar energy system 200 is removably attached or embedded in the fabric. The system is utilized with awnings as used by pools, restaurants, apartment buildings, trucks, boats, or trailers. Specifically, FIGS. 15A-15F show the solar system 200 applied to boat awnings and truck awnings, as well as tents, lean-tos, and bunkers.

Figure 16:
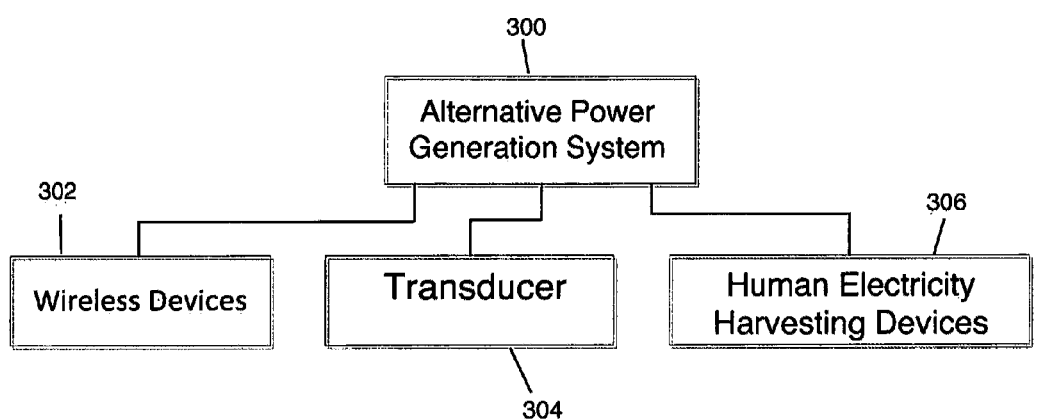
FIG. 16 is a diagram illustrating various configurations of a third embodiment of the present invention, wherein alternative power generation systems are provided.

Referring to FIG. 16, shown is a diagram illustrating various configurations of a third embodiment of the present invention comprising alternative power generation systems 300 used with wireless devices 302, transducers 304, and/or human electricity harvesting devices 306 (e.g., by Microchip Technology, Inc.). Wireless devices 302 include Bluetooth, Zigbee, WiFi, WiMax, or other wireless technology, which communicate with other systems, sensors, or devices. The wireless technology could be embedded such as an embedded Zigbee/mesh network (e.g., by EnOcean, Inc.). Further, the alternative power generation system 300 could be used with wireless devices for home automation, such as for use with video, architectural features, kitchen appliances, or TV/radio. It is also contemplated that wireless devices 302 could include those devices capable of wirelessly transmitting power. The alternative power generation system 300 could also be used with embedded LED systems, remote controls, worldwide data, and environmental monitoring systems, such as those that measure rain, air pressure, $CO_2$, or light.

Further, the alternative power generation system 300 could also be used with transducers 304, such as components and/or sensors, which include technology related to steady state and scavenged vibration, linear motion, waste energy, electromagnetic fields, fluid flow fluctuation (such as from rain, tides, waves, or wind turbines), machine oscillations (such as from a car/truck, airplane, or train), and piezoelectric transducers (such as provided by MicroGen).

Still further, the alternative power generation system 300 could be used with human electricity harvesting devices 306 which include thermoelectric generators, electrostatic energy harvesters, conductive body technology, scalp tapping, mitochondria energy pulsation, hand, feet, and body exercise electrical converter, power skins (including fabric and paper), and fiber conductive electronic fabrics (Eeonyx Corp.). The power skins are formed from printed or laminated multi-layer structures, as discussed in greater detail below. To the extent any power can be conducted or generated by the human body, the alternative power generation system 300 can be used with any electricity harvesting device capable of utilizing such power. The alternative power generation system 300 can also be used with hand power energy printers to print the circuit, such as provided by Methode Electronics.

Shown in FIGS. 17A-17D are various depictions of the types of devices and technology, as discussed above, that can used with the system of the present invention including body conductivity, Zigbee communication, piezoelectric disk (e.g., for a guitar pick), and wireless sensor network.

Figure 17A:
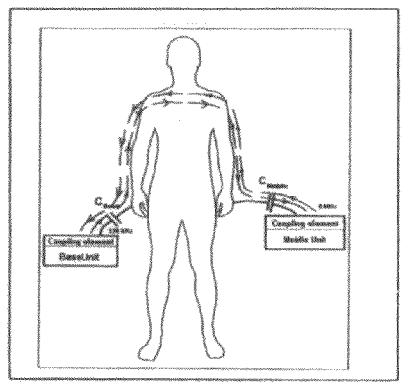
FIGS. 17A-17D are views of various wireless devices, human electricity harvesting technology, and transducers capable of being used with the present invention.
Figure 17B:
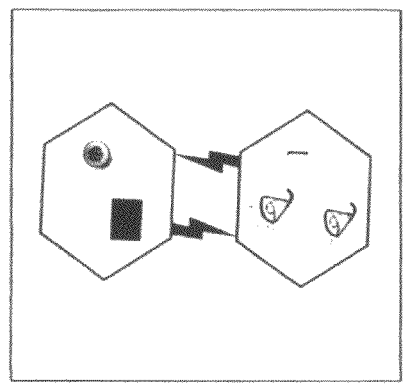
Figure 17C:
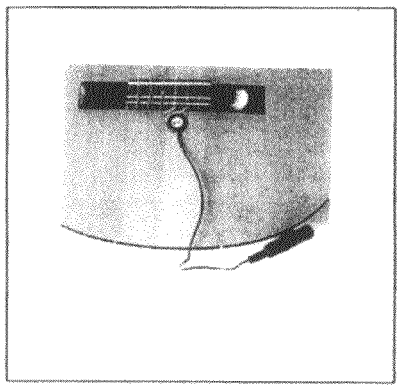
Figure 17D:
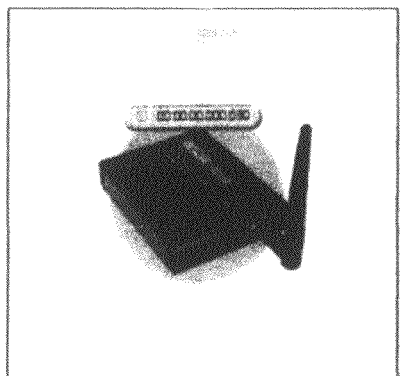
Figure 18A:
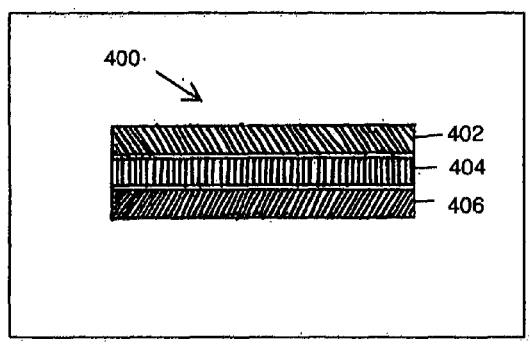
FIGS. 18A-18C are diagrams of a fourth embodiment of the present invention, wherein a multi-layered solar power generation device is provided.
Figure 18C:
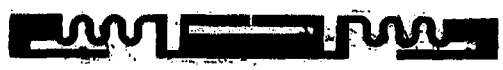
Figure 18B:
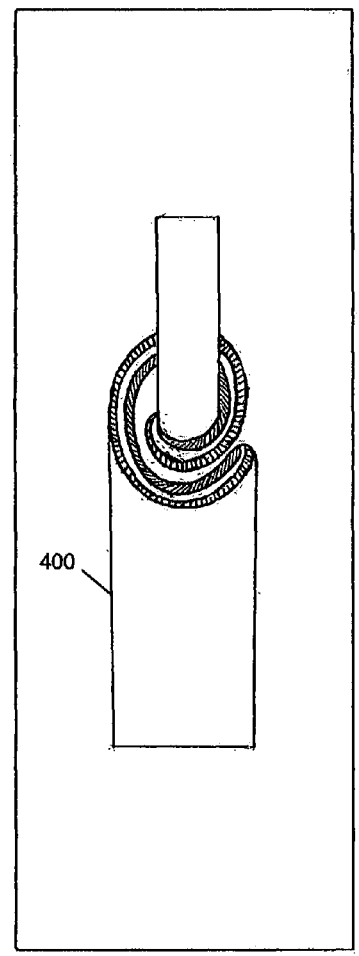

Referring to FIGS. 18A-18C, shown are diagrams of a fourth embodiment of the present invention, wherein a multi-layered solar power generation device 400 is provided. The multi-layered solar power generation device 400 could be used in connection with any of the previous embodiments, where the device 400 would provide the same functionality as the flexible solar panel 14 and power module 16. As shown in FIG. 18A, the device 400 could comprise a layer of substrate 408 with a first layer 406 formed on the substrate including battery electronics therein, a second layer 404 formed on the first layer and including power electronics therein, and a third layer 402 formed on the second layer and including photovoltaic material for generating electricity. The multi-layered solar power generation device 400 is lightweight and is produced by layering solar cells, batteries, circuits, and sensors into a multi-layered, thin device to create an integrated energy delivery system. Referring to FIG. 17B, the multi-layered solar power generation device 400 could be flexible and wrapped around a tent pole, umbrella stand, human appendage, or other objects. The multi-layered solar power generation device 400 could be made into a large scale roll to wrap around building columns, posts, and beams. As referenced in FIG. 17C, the printed power device could be printed using conductive inks (such as silver, copper, or carbon) that can print solar cells, batteries, circuits, and sensors onto plastic slices, paper, curved glass, fabric, or foil, such as provided by Vorbeck Materials. The layers can be laminated individually or laminated together with bi- and tri-laminates that comprise layers of moisture resistant translucent film with electronic connection capabilities embedded in each layer.

Figure 19:
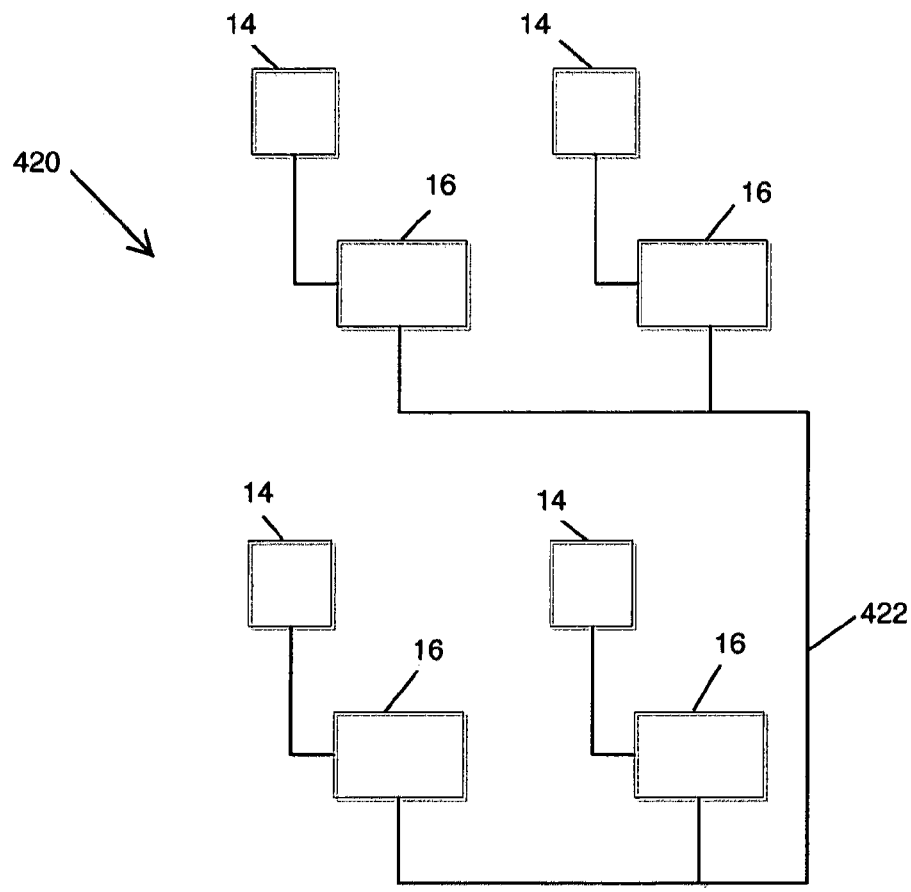
FIGS. 19-20 are views of a fifth embodiment of the present invention, wherein an energy network system is provided and can be used with any of the previous embodiments of the present invention.
Figure 20:
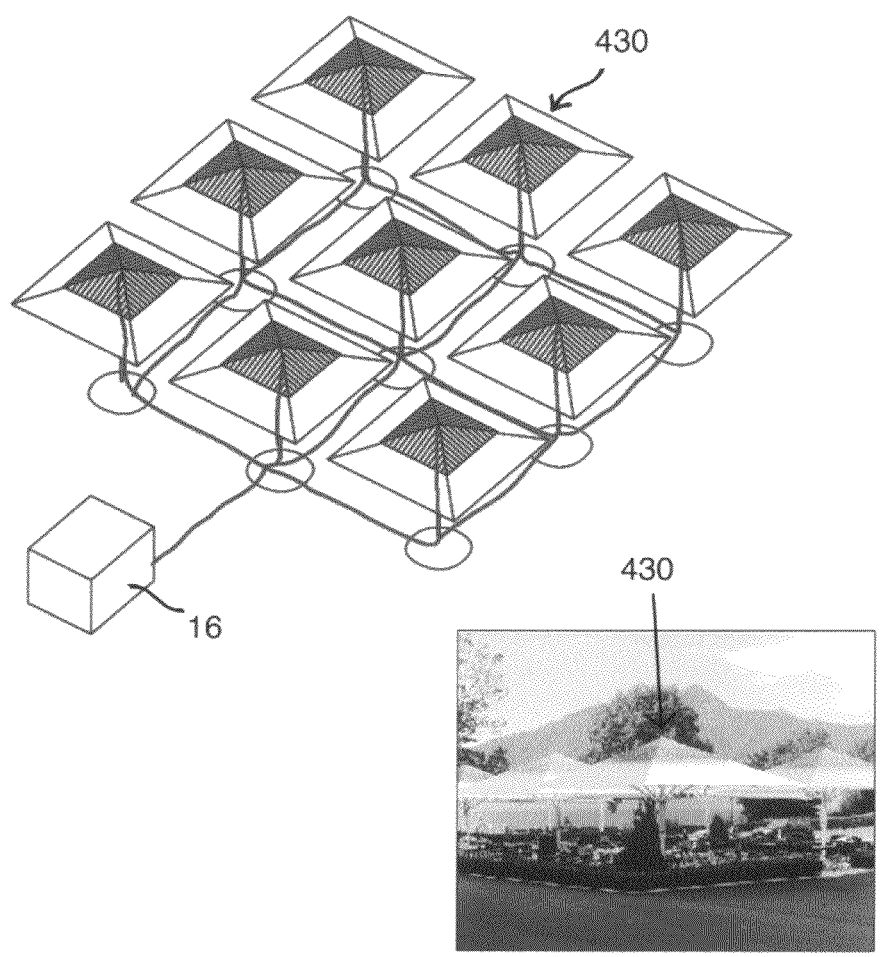

Referring to FIGS. 19-20, shown are views of a fifth embodiment of the present invention, wherein an energy network system is provided and can be used with any of the previous embodiments of the present invention. As shown generally in FIG. 20, an energy network system 420 comprises a plurality of flexible solar panels 14 and a plurality of power modules 16 in electrical communication with one another by a distribution bus 422, which are connected by the modular connection port 26 of the power module 16 as discussed above. Such cabling can be carried within carrying unit 12. Such a network system has the advantage of sharing and allocating power among the various energy systems 10, which is advantageous if one of the systems 10 malfunctions, if one of the flexible solar panels 14 is temporarily blocked from sunlight, or if one system 10 produces more energy than it requires at that time. Referring to FIG. 21, an alternative is to create an energy network system 430 where each system of the present invention shares one power module 16, rather than each system having its own power module.

The modular portable energy system, in all of the embodiments disclosed herein, has many applications including recreational activities, military applications, etc. For example, the modular portable energy system can be attached to trees, tent roofs, cars, or boats, or can be worn over a person's body as a poncho. Moreover, the system could be used to provide energy in situations where a home must be evacuated, or power has been cut off or disrupted, by a flood, hurricane, tornado, earthquake, or any other disaster situation. It could be used by staffed personnel, evacuees, or others to provide energy quickly and effectively to power medical equipment, communication equipment, cooking equipment, and/or any other electronic device. Additionally, the system could be used in military applications. For instance, it may be necessary to set up and take down camp quickly and efficiently, especially when in foreign territory, thus requiring an effective means to provide energy to soldiers, officers, or other military personnel to power communications equipment, monitoring equipment, personal devices, and/or other electronic devices. To this end, the system could be used with large military tents or smaller personal tents. Importantly, the modular portable energy system represents an entirely new platform for generating electrical energy with scaleability and flexibility to accommodate the power needs of not only one person, but indeed, entire communities of people.

Having thus described the invention in detail, it is to be understood that the foregoing description is not intended to limit the spirit or scope thereof. What is desired to be protected is set forth in the following claims.

What is claimed is:

1. A modular portable energy system, comprising:
   a flexible solar panel;
   a power module in electrical communication with the solar panel and attached to a periphery of the flexible solar panel, the power module including a rechargeable battery, a circuit, and a distribution component output;
   one or more appliance kits powered by, and in electrical communication with, the power module via one or more distribution components connected to the distribution component output of the power module; and
   a carrying unit for housing and transporting the flexible solar panel, the power module, the one or more appliance kits, and the one or more distribution components.

2. The modular portable energy system of claim 1, wherein the carrying unit further comprises a carrying retainer having an integrated handle and wrapped around the flexible solar panel and power module for storage or transportation.

3. The modular portable energy system of claim 1, wherein the carrying unit further comprises a body component having storage sub-compartments and a handle attached thereto.

4. The modular portable energy system of claim 1, wherein the carrying unit comprises a central subcontainer positioned between a bottom subcontainer and a top subcontainer.

5. The modular portable energy system of claim 1, further comprising a support frame with the flexible solar panel suspended therefrom.

6. The modular portable energy system of claim 1, wherein the power module includes a modular expansion port networkable to a plurality of energy systems.

7. The modular portable energy system of claim 1, further comprising one or more wireless devices in electrical communication with the modular personal energy system.

8. The modular portable energy system of claim 1, wherein the flexible solar panel is attached to fabric.

9. The modular portable energy system of claim 1, wherein the flexible solar panel is embedded in fabric.

10. The modular portable energy system of claim 1, further comprising a portable and collapsible structure, wherein the flexible solar panel is attached to the structure.

11. The modular portable energy system of claim 10, wherein the structure further comprises one or more power access points dispersed throughout the structure and in electrical communication with the solar panel.

12. The modular portable energy system of claim 10, wherein the solar panel is removably attached to the structure.

13. The modular portable energy system of claim 10, wherein the solar panel is embedded in fabric of the structure.

14. The modular portable energy system of claim 10, wherein the structure includes an awning, umbrella, or tent.

15. The modular portable energy system of claim 1, wherein the power module is sized for lightweight usage.

16. The modular portable energy system of claim 15, further comprising:
   a layer of laminated substrate;
   a first layer formed on the laminated substrate including a battery therein;
   a second layer formed on the first layer and including circuits therein; and
   a third layer formed on the second layer and including solar cells therein.

17. The modular portable energy system of claim 16, wherein the first layer, second layer, and third layer are laminated together.

18. The modular portable energy system of claim 16, wherein the first layer, second layer, and third layer are printed using conductive inks.

19. The modular portable energy system of claim 16, wherein the first layer, second layer, and third layer have interstitial wiring in between.

20. The modular portable energy system of claim 16, wherein at least one of the layers comprises sensors.

* * * * *